United States Patent
Chang et al.

(10) Patent No.: US 9,661,794 B1
(45) Date of Patent: May 23, 2017

(54) METHOD OF MANUFACTURING PACKAGE STRUCTURE

(71) Applicant: Taiwan Semiconductor Manufacturing Co., Ltd., Hsinchu (TW)

(72) Inventors: Shou-Zen Chang, New Taipei (TW); Chen-Hua Yu, Hsinchu (TW); Chung-Shi Liu, Hsinchu (TW); Kai-Chiang Wu, Hsinchu (TW); Wei-Ting Lin, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/208,627

(22) Filed: Jul. 13, 2016

(51) Int. Cl.
| | |
|---|---|
| H05K 13/02 | (2006.01) |
| H01L 23/538 | (2006.01) |
| H01L 23/00 | (2006.01) |
| H05K 3/34 | (2006.01) |
| H05K 13/04 | (2006.01) |
| H01L 21/683 | (2006.01) |

(52) U.S. Cl.
CPC ....... *H05K 13/028* (2013.01); *H01L 21/6835* (2013.01); *H01L 23/5384* (2013.01); *H01L 23/5386* (2013.01); *H01L 23/5389* (2013.01); *H01L 24/11* (2013.01); *H01L 24/14* (2013.01); *H01L 24/96* (2013.01); *H05K 3/3442* (2013.01); *H05K 3/3489* (2013.01); *H05K 3/3494* (2013.01); *H05K 13/0465* (2013.01); *H01L 2224/02379* (2013.01); *H01L 2224/12105* (2013.01); *H01L 2224/13023* (2013.01); *H01L 2224/13024* (2013.01); *H01L 2224/13025* (2013.01); *H01L 2224/14181* (2013.01); *H01L 2924/19102* (2013.01)

(58) Field of Classification Search
CPC ............ H01L 21/6835; H01L 23/5384; H01L 23/5386; H01L 23/5389
See application file for complete search history.

(56) References Cited

U.S. PATENT DOCUMENTS

| | | | |
|---|---|---|---|
| 5,762,259 A * | 6/1998 | Hubacher | H01L 24/11 228/180.22 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |

(Continued)

*Primary Examiner* — Errol Fernandes
(74) *Attorney, Agent, or Firm* — Jianq Chyun IP Office

(57) ABSTRACT

A method of manufacturing a package structure includes at least the following steps. A wafer is provided. A flux layer is applied onto at least part of the wafer. A stencil is provided over the wafer. The stencil includes a plurality of apertures exposing the flux layer. A dispenser is provided over the stencil. A plurality of SMDs are fed over the stencil with the dispenser. The dispenser is moved to drive the SMDs into the apertures of the stencil. The stencil is removed and the flux layer is reflowed.

20 Claims, 19 Drawing Sheets

(56) References Cited

U.S. PATENT DOCUMENTS

| | | | |
|---|---|---|---|
| 2004/0069840 A1* | 4/2004 | Mackay | B23K 1/0016 228/248.1 |
| 2004/0169275 A1* | 9/2004 | Danvir | H01L 21/563 257/737 |
| 2009/0283575 A1* | 11/2009 | Budd | B23K 1/0016 228/246 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

* cited by examiner

METHOD OF MANUFACTURING PACKAGE STRUCTURE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. Therefore, reduction of fabrication costs and acceleration of production time of the integrated fan-out packages have become important issues in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
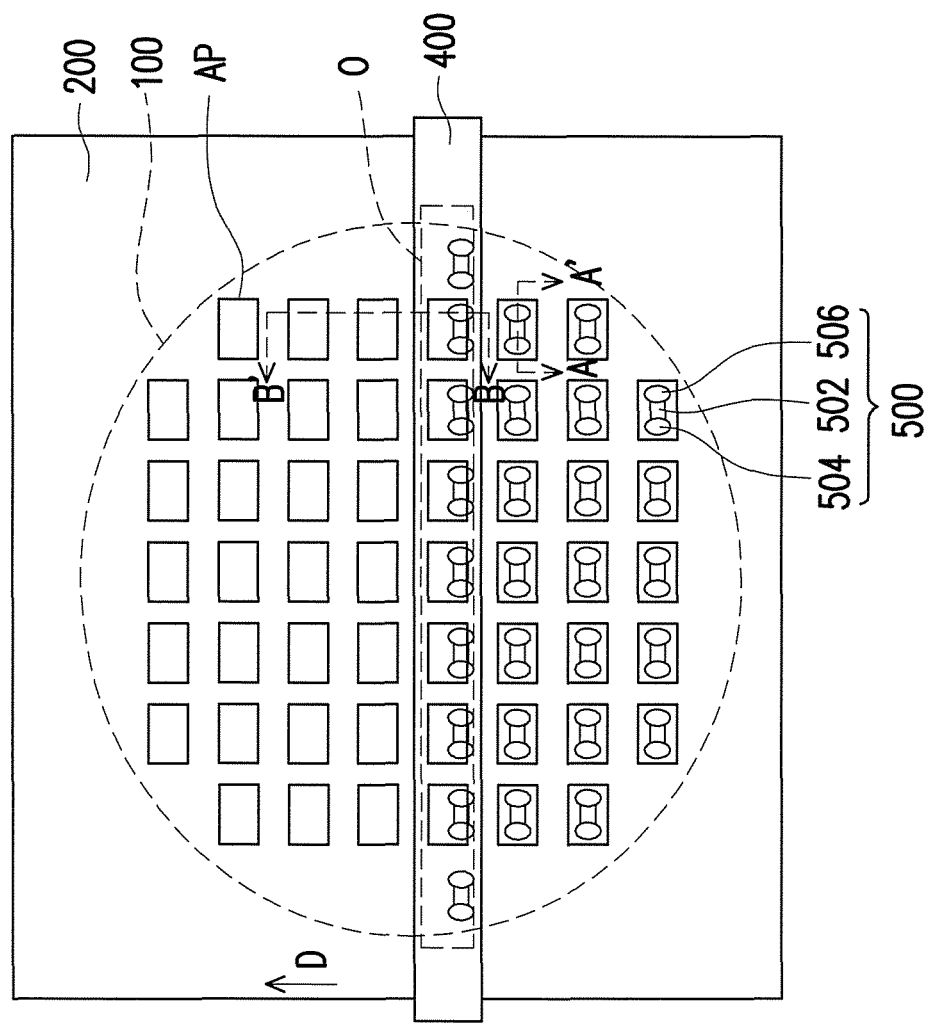
FIG. 1 is a schematic top view of a step of a method for manufacturing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
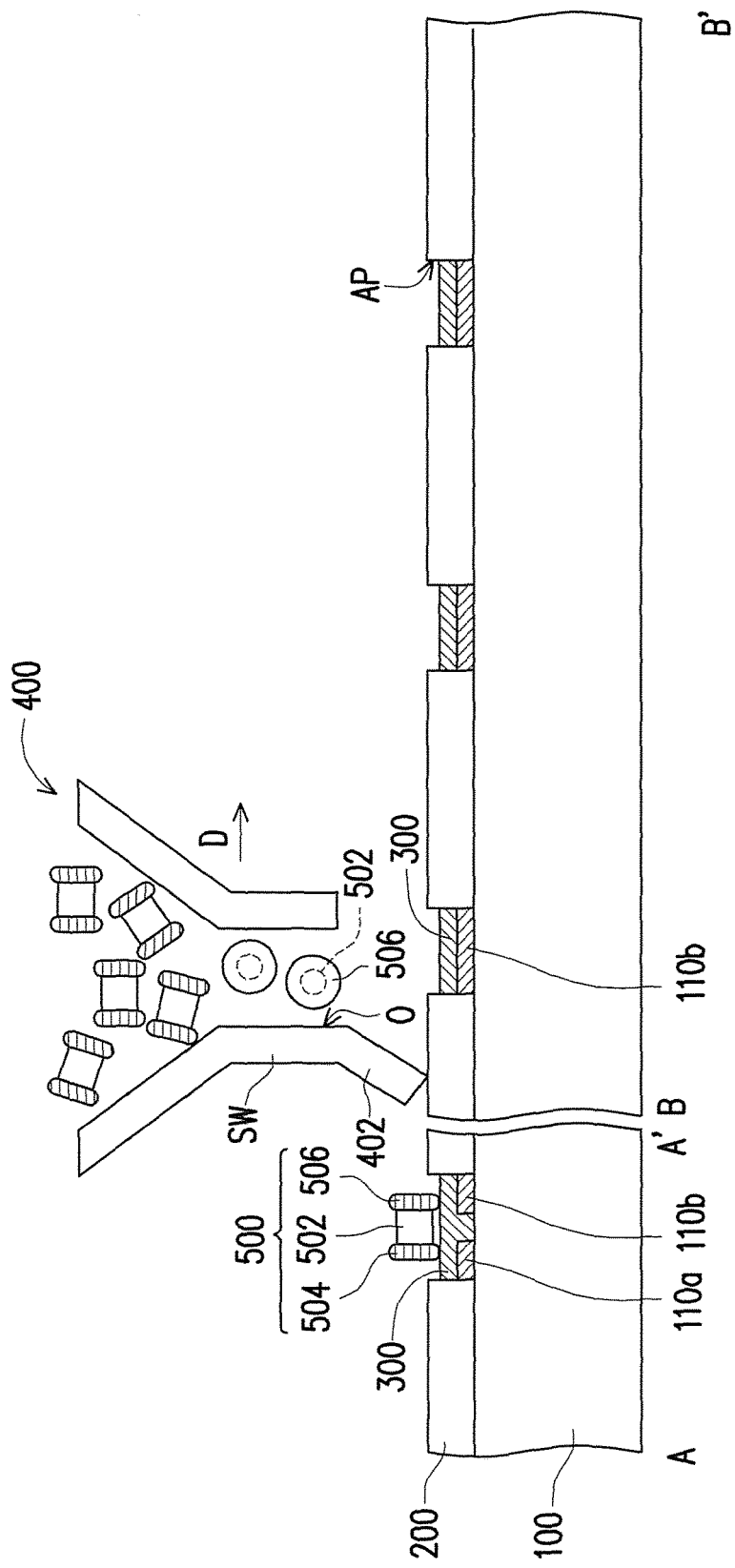
FIGS. 2A-2E are cross-sectional views of the step along lines A-A' and B-B' depicted in FIG. 1.
Figure 2B:
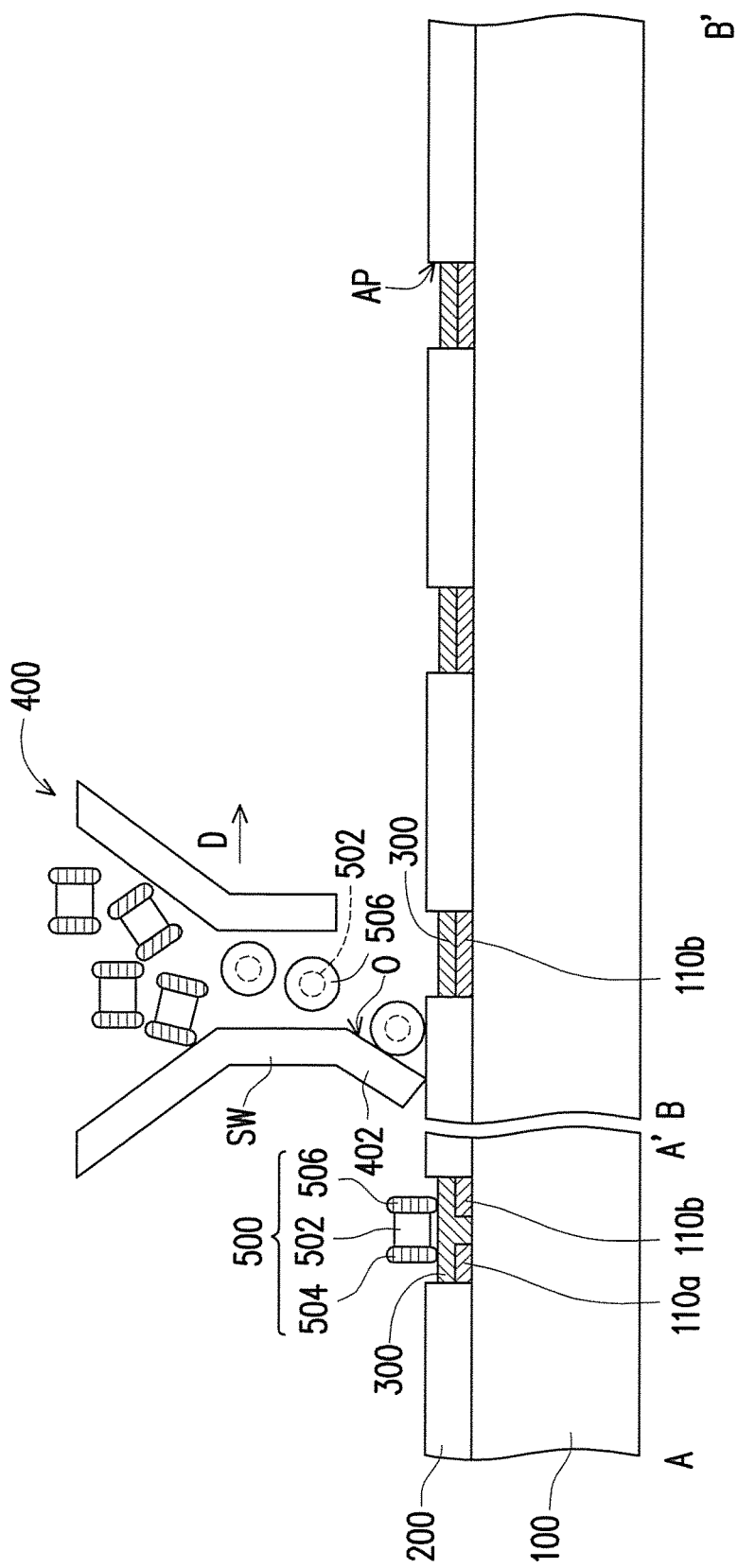
Figure 2C:
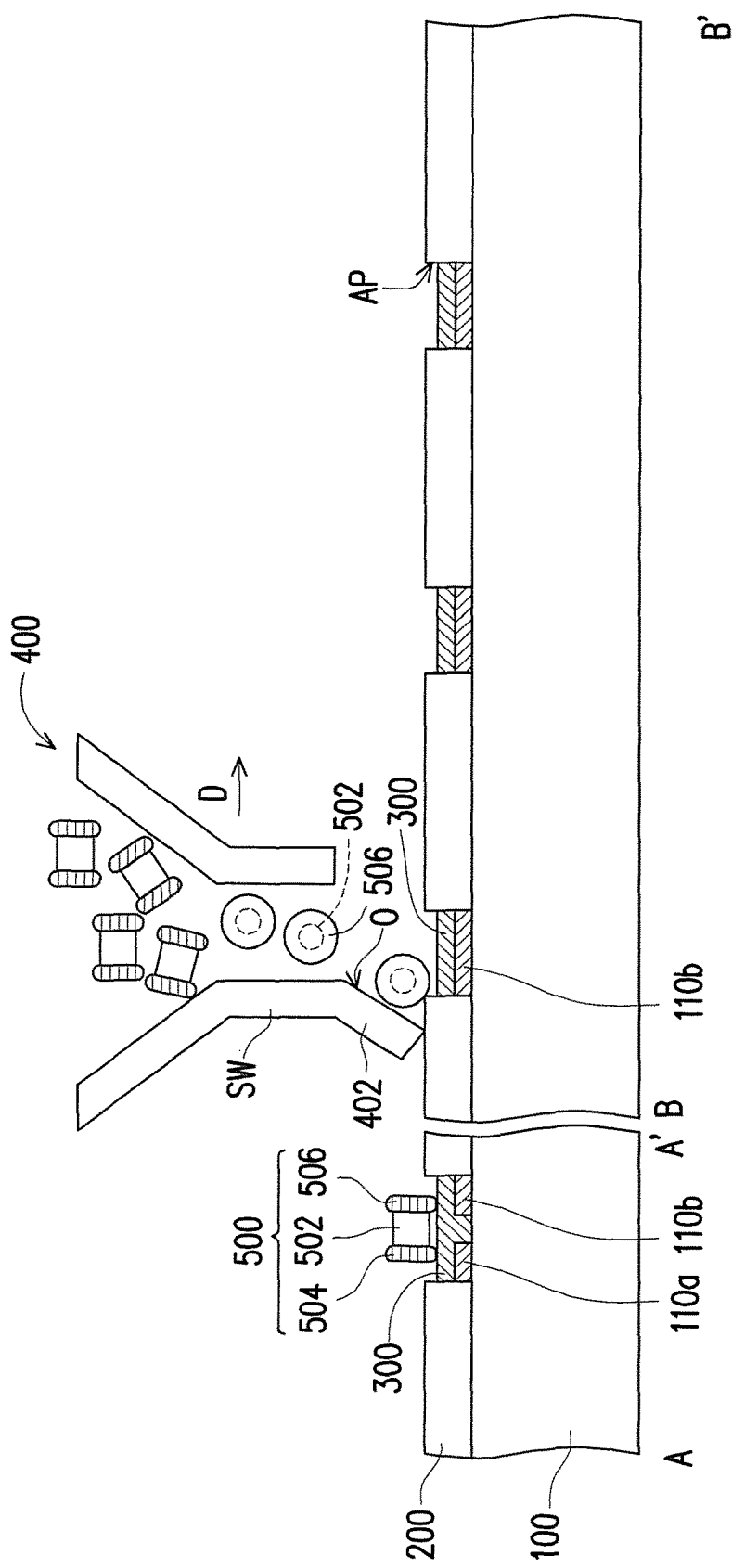
Figure 2D:
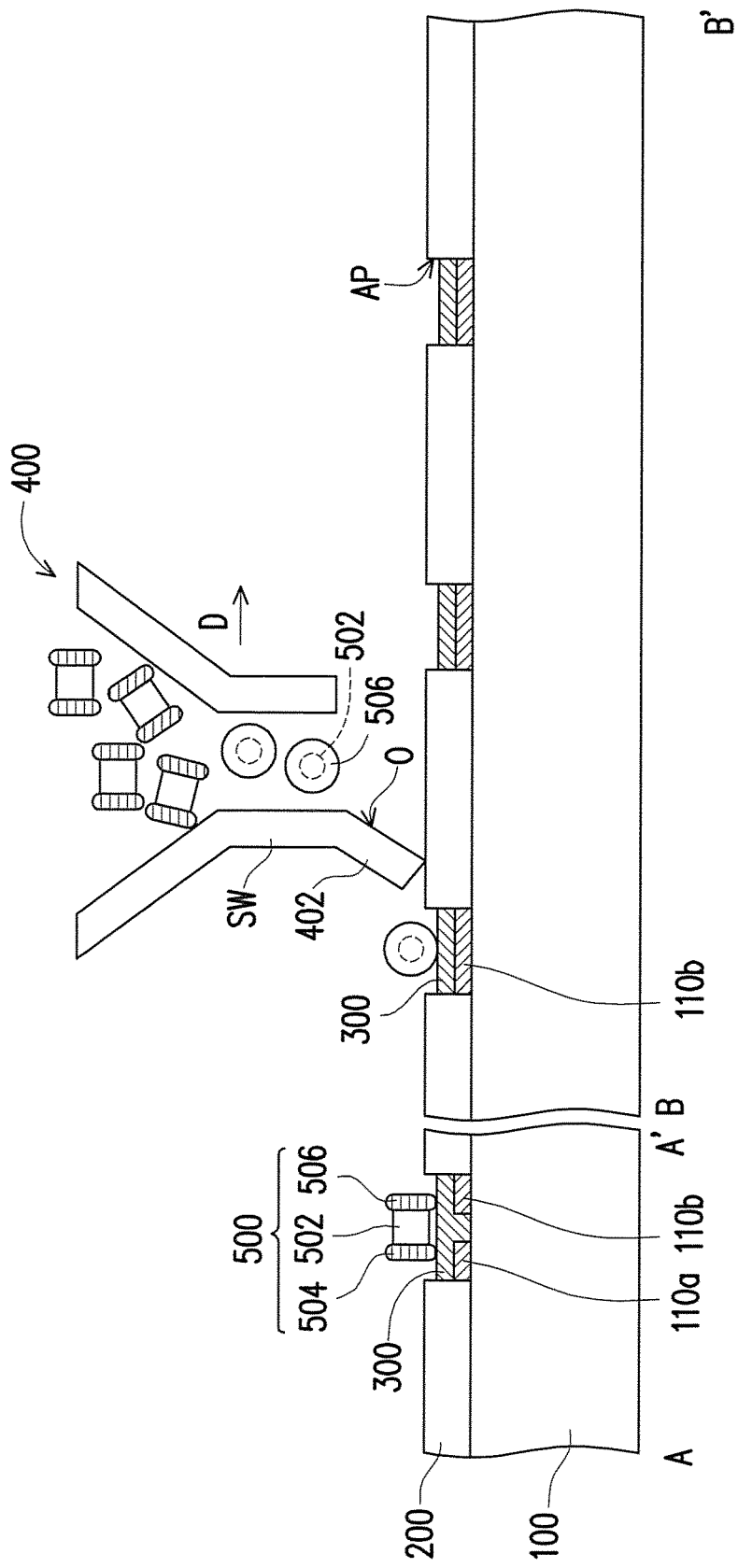

FIG. 1 is a schematic top view of a step of a method for manufacturing a package structure 10 in accordance with some embodiments. FIGS. 2A-2E are cross-sectional views of the step along lines A-A' and B-B' depicted in FIG. 1. FIG. 3 is a detailed cross-sectional view of the wafer 100 depicted in FIGS. 2A-2E. Referring to FIG. 1 and FIG. 2A, a wafer 100 is provided. The details of the wafer 100 are illustrated in FIG. 3. Referring to FIG. 2A and FIG. 3, the wafer 100 includes a carrier C, a de-bonding layer DB, an adhesion layer AD, a plurality of conductive posts 102, a plurality of integrated circuit 104, an insulating encapsulation 106, and a redistribution circuit structure 108. In some embodiments, the de-bonding layer DB is formed on the upper surface of the carrier C, and the de-bonding layer DB is between the carrier C and the adhesion layer AD. In other words, the de-bonding layer DB and the adhesion layer AD are stacked on the carrier C in sequential order. The carrier C is, for example, a glass substrate. On the other hand, in some embodiments, the de-bonding layer DB is a light-to heat-conversion (LTHC) release layer formed on the glass substrate. However, the materials of the de-bonding layer DB and the carrier C are merely for illustration, and the disclosure is not limited thereto.

The conductive posts 102 are located over the adhesion layer AD. In some embodiments, each of the conductive posts 102 includes a first portion 102a and a second portion 102b connected to the first portion 102a. In detail, the second portions 102b of the conductive posts 102 are adhered to the adhesion layer AD. In some embodiments, the second portions 102b of the conductive posts 102 are partially embedded in the adhesion layer AD. However, in some alternative embodiments, the second portions 102b may be substantially coplanar with the upper surface of the adhesion layer AD and is not embedded in the adhesion layer AD. The first portions 102a and the second portions 102b of the conductive posts 102 may be made from the same material or may be made from different materials.

The integrated circuits 104 are mounted onto the adhesion layer AD having the conductive posts 102 adhered thereon. In detail, the integrated circuits 104 are arranged in an array and are surrounded by the conductive posts 102. The integrated circuits 104 are, for example, semiconductor dies. Therefore, the adhesion layer AD serves as a die attach film (DAF). Each of the integrated circuits 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c, the conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the protection layer 104e may be a polybenzoxazole (PBO) layer, a polyimide (PI) layer or other suitable polymers. In some alternative embodiments, the protection layer 104e may be made of inorganic materials. As illustrated in FIG. 3, the top surface of the integrated circuit 104 is lower than the top surfaces of the conductive posts 102. However, the disclosure is not limited thereto. In some alternative embodiments, the top surface of the integrated circuit 104 may be substantially coplanar with the top surfaces of the conductive posts 102.

The insulating encapsulation 106 is also located over the adhesion layer AD. Specifically, the insulating encapsulation 106 encapsulates the sidewalls of the integrated circuits 104, and the insulating encapsulation 106 is penetrated by the conductive posts 102. In other words, the integrated circuits 104 and the conductive posts 102 are embedded in the insulating encapsulation 106. It should be noted that although the integrated circuits 104 and the conductive posts 102 are embedded in the insulating encapsulation 106, the insulating encapsulation 106 exposes top surfaces of the integrated circuits 104 and the conductive posts 102. In other words, the top surfaces of the conductive posts 102, the top surface of the protection layer 104e, and the top surfaces of the conductive pillar 104d are substantially coplanar with the top surface of the insulating encapsulation 106. In some embodiments, the insulating encapsulation 106 is a molding compound formed by a molding process. In some alternative embodiments, the insulating encapsulation 106 may include epoxy or other suitable materials.

The redistribution circuit structure 108 is located over the conductive pillars 102, the integrated circuits 104, and the insulating encapsulation 106. In detail, the redistribution circuit structure 108 is electrically connected to the conductive pillars 104d of the integrated circuits 104 and the conductive posts 102. The redistribution circuit structure 108 includes a plurality of inter-dielectric layers 108a and a plurality of redistribution conductive layers 108b stacked alternately. The redistribution conductive layers 108b are electrically connected to the conductive pillar 104d of the integrated circuits 104 and the conductive posts 102 embedded in the insulating encapsulation 106. In some embodiments, the top surfaces of the conductive pillars 104d and the top surfaces of the conductive posts 102 are in contact with the bottommost redistribution conductive layer 108b of the redistribution circuit structure 108. The top surfaces of the conductive pillars 104d and the top surfaces of the conductive posts 102 are partially covered by the bottommost inter-dielectric layer 108a. Furthermore, the topmost redistribution conductive layer 108b includes a plurality of first pads 110a, a plurality of second pads 110b, and a plurality of third pads 110c. It should be noted that since the redistribution conductive layer 108b of the redistribution circuit structure 108 extends over the insulating encapsulation 106, the structures formed over the carrier C may be referred as an integrated fan-out (INFO) package structure. In other words, the wafer 100 includes a plurality of INFO package structures arranged in an array.

Referring to FIG. 1 and FIG. 2A, a flux layer 300 is applied onto at least part of the wafer 100. In detail, the flux layer 300 is applied onto the first pads 110a and the second pads 110b of the wafer 100. In some embodiments, the flux layer 300 may include flux with high viscosity. The flux layer 300 may be applied onto the first pads 110a and the second pads 110b through, for example, dipping, brushing, syringe dispensing, printing, or spraying. Moreover, a stencil 200 is provided over the wafer 100. The stencil 200 has a plurality of apertures AP, and the apertures AP expose the flux layer 300. In some embodiments, since the area occupied by the flux layer 300 is substantially equal to the area of the apertures AP of the stencil 200, the stencil 200 may be placed over the wafer 100 before the flux layer 300 is applied. In other words, the apertures AP of the stencil 200 expose the first pads 110a and the second pads 110b, so the stencil 200 may serve as a mask to outline regions in which the flux layer 300 may be applied thereon. Under this scenario, the flux layer 300 over one of the first pads 110a is connected to the flux layer 300 over one of second pad 110b, as illustrated in FIG. 2A. Therefore, the flux layer 300 may be applied onto the first pads 110a and the second pads 110b simultaneously, so as to accelerate the production time while reducing the manufacturing cost. However, the foregoing configuration construes no limitation in the disclosure. In some alternative embodiments, the flux layer 300 over the first pads 110a may be separated from the flux layer 300 over the second pads 110b. In detail, a first stencil (not illustrated) having apertures exposing the first pads 110a are placed over the wafer 100. The first stencil shields the second pads 110b, and the flux layer 300 is applied onto the first pads 110a. Thereafter, the first stencil is removed and a second stencil (not illustrated) is placed over the wafer 100. The second stencil covers the first pads 110a having the flux layer 300 formed thereon, and apertures of the second stencil expose the second pads 110b. The flux layer 300 is applied onto the second pads 110b through the apertures of the second stencil. Subsequently, the second stencil is removed and the stencil 200 having apertures AP exposing the first pads 110a and the second pads 110b simultaneously is disposed over the wafer 100 for the subsequent device mounting process. Under this scenario, the step of applying the flux layer 200 onto the second pads 110b is performed after the step of applying the flux layer 200 onto the first pads 110a is completed.

A dispenser 400 is provided over the stencil 200. The dispenser 400 includes a dispensing opening O and a squeegee 402. The dispensing opening O of the dispenser 400 is able to dispense a plurality of surface mount devices (SMD) 500. In some embodiment, the squeegee 402 extends from a sidewall SW of the dispensing opening O. However, the disclosure is not limited thereto. In some alternative embodiments, the squeegee 402 may be separated from the dispenser 400. As illustrated in FIG. 1, an area of the dispensing opening O of the dispenser 400 corresponds to more than one apertures AP of the stencil 200.

Referring to FIG. 1 and FIG. 2A to FIG. 2D, the dispenser 400 feeds a plurality of SMDs 500 over the stencil. The dispenser 400 moves along a moving direction D, and the squeegee 402 is able to scrape the SMDs 500 into the apertures AP of the stencil 200 during the movement of the dispenser 400. The SMD 500 may include one or more passive components. The passive component is, for example, a capacitor, a resistor, an inductor, an antenna, the like, or a combination thereof. In some embodiments, the SMD 500 consists essentially of one or more passive devices and does not include an active device such as a transistor. Each of the SMDs 500 includes a body 502, a first conductive terminal 504, and a second conductive terminal 506. The first conductive terminal 504 and the second conductive terminal 506 are respectively located on two ends of the body 502. In some embodiments, the body 502 of the SMD 500 may be made of insulating materials while the first conductive terminal 504 and the second conductive terminal 506 may be made of metallic materials. It should be noted that the orientation of the SMDs 500 illustrated in FIG. 2A is merely an exemplary illustration. The SMDs 500 may also exhibit orientations other than the orientations shown in FIG. 2A.

Figure 4A:
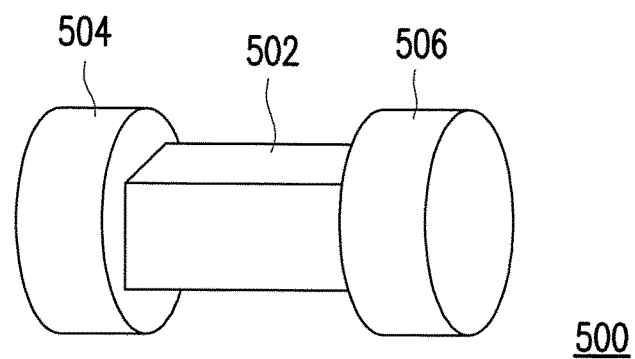
FIGS. 4A-4C are enlarged view of the surface mount device (SMD) depicted in FIG. 1.
Figure 4B:
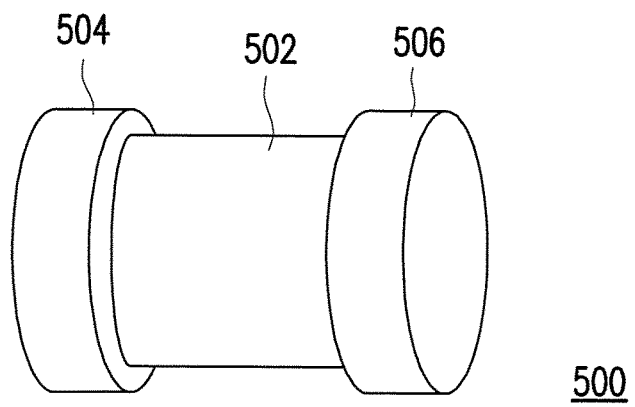
Figure 4C:
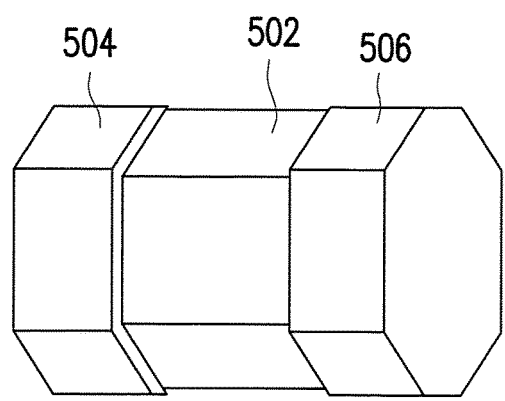

Due to the specific design of the SMDs 500, the SMDs 500 are able to roll in a desired direction with the aid of the squeegee 402. The specific configuration of the SMDs 500 is described below. FIGS. 4A-4C are enlarged view of the SMD 500 depicted in FIG. 1. Referring to FIG. 4A, in some embodiments, the body 502 of the SMD 500 in rectangular. On the other hand, the first conductive terminal 504 and the second conductive terminal 506 are cylindrical. In detail, the lateral surfaces of the first conductive terminal 504 and the second conductive terminal 506 (surfaces touching the squeegee 402 and the stencil 200) are smooth and round. As such, the SMDs 500 are able to roll on the upper surface of the stencil 200, so the squeegee 402 of the dispenser 400 may easily drive the SMDs 500 into the apertures AP of the stencil 200. Referring to FIG. 4B, in some alternative embodiments, similar to the configuration presented in FIG. 4A, the first conductive terminals 504 and the second conductive terminals 506 of the SMD 500 are also cylindrical. However, instead of being rectangular, the body 502 in FIG. 4B is cylindrical. Similar to the SMD 500 in FIG. 4A, the cylindrical terminals in FIG. 5B also aids the rollability of the SMDs 500. In FIG. 4A and FIG. 4B, the first conductive terminals 504 and the second terminals 506 are cylindrical to enhance the rollability of the SMDs 500, but they construe no limitation in the disclosure. The terminals of the SMDs 500 may take other forms as long an angle between two adjacent lateral surfaces (the surfaces touching the squeegee 402 and the stencil 200) is larger than 90°. For example, referring to FIG. 4C, the first conductive terminal 504 and the second conductive terminal 506 may be octagonal. Since an angle between each sides of the octagon is larger than 90°, the rollability of the SMDs 500 may be ensured. On the other hand, as illustrated in FIG. 4C, the body 502 of the SMD 500 is also octagonal to further assist rolling of the SMD 500. It should be noted that FIGS. 4A-4C merely illustrated exemplary configurations of the SMDs 500 and are not intended to limit the shape of the SMDs 500. The SMDs 500 may also take other possible shapes or forms as long as the SMDs 500 are able to roll on the upper surface of the stencil 200, so as to be driven into the apertures AP.

Referring back to FIG. 1, the moving direction D of the dispenser 400 extends along the diameter of the wafer 100. Moreover, in some embodiments, a length of the dispensing opening O is larger than the diameter of the wafer 100. Therefore, while the dispenser 400 moves along the moving direction D, the squeegee 402 of the dispenser 400 is able to scrape the SMDs 500 such that each of the SMDs 500 is simultaneously being driven into each of the corresponding aperture AP arranged in a row. In other words, multiple SMDs 500 may be mounted onto the wafer 100 at once. As such, mass production with shorter production time and lower manufacturing cost may be achieved. As illustrated in FIG. 2D, within each of the apertures AP, the first conductive terminal 504 is located over the first pads 110a while the second conductive terminal 506 is located over the second pads 110b. In other words, the first conductive terminals 504 are connected to the first pads 110a through the flux layer 300. Similarly, the second conductive terminals 506 are connected to the second pads 110b through the flux layer 300. It should be noted that during the SMD mounting process, other mechanisms may be used in conjunction with the squeegee 402. For example, the SMDs 500 may be subjected to a specific vibration frequency to further aid the rolling of the SMDs 500. On the other hand, the wafer 100 may be tilted, so the SMDs 500 are driven by gravitational force. The foregoing mechanism may be used in combination with the squeegee 402 to further enhance the rollability of the SMDs 500, but the disclosure is not limited thereto. In some alternative embodiments, the SMDs 500 may be driven by the vibration and gravitational force without the presence of the squeegee 402.

Figure 2E:
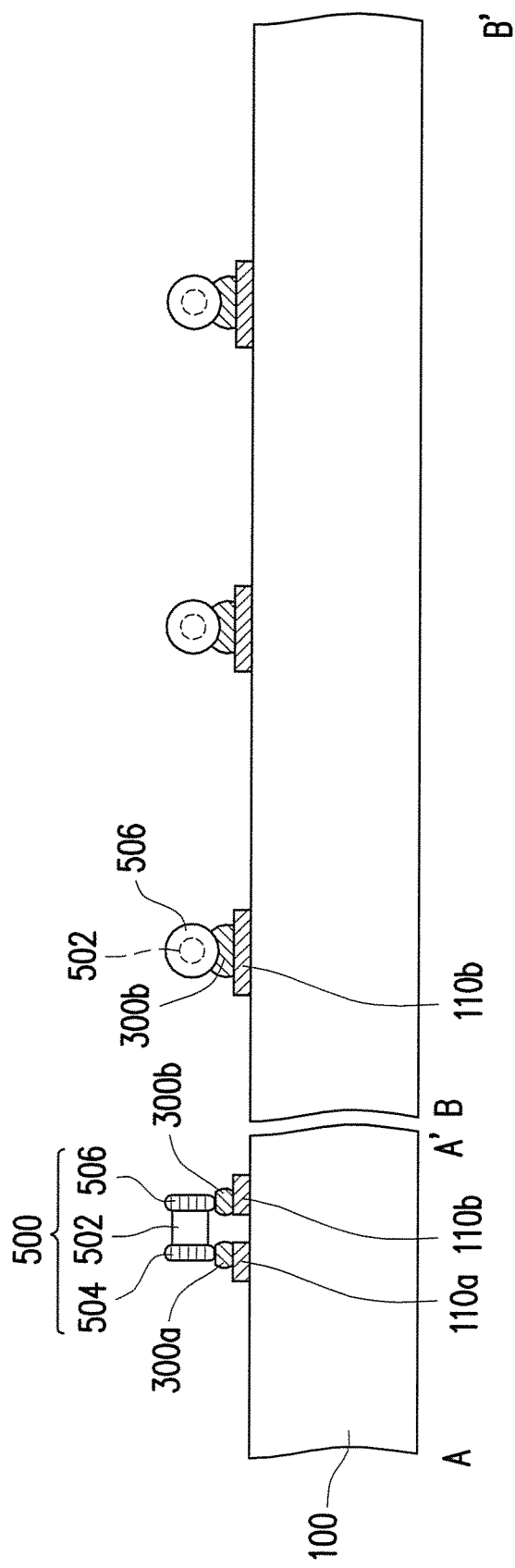
Figure 3:
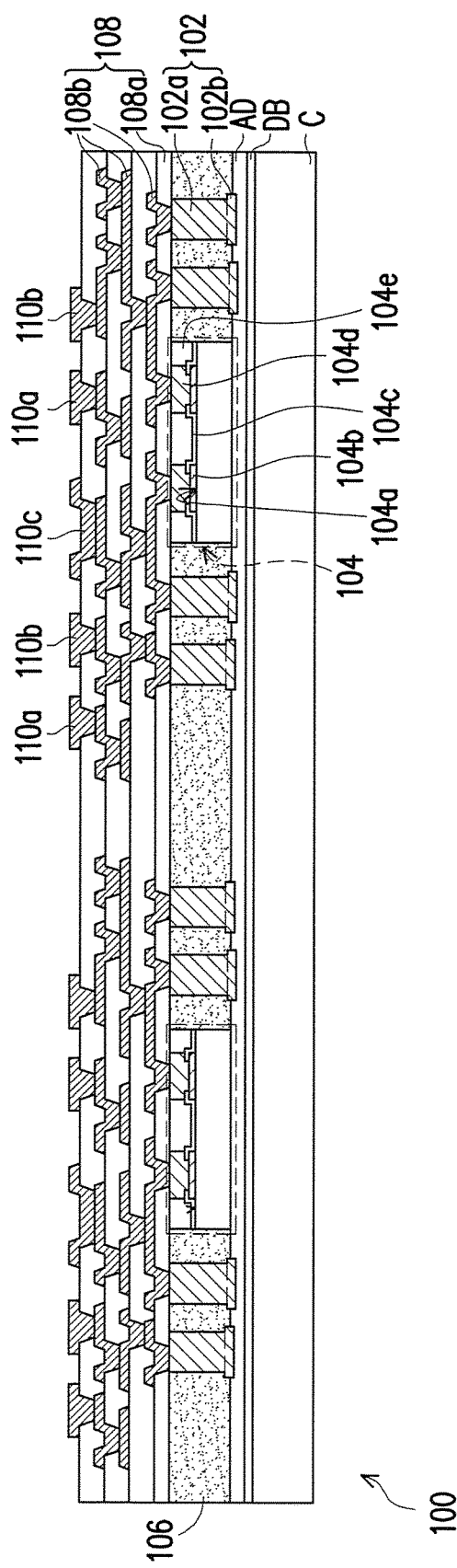
FIG. 3 is a detailed cross-sectional view of the wafer depicted in FIGS. 2A-2E.

Referring to FIG. 2E, the stencil 200 is removed and a reflow process is performed on the flux layer 300 to bond the wafer 100 and the SMDs 500. It should be noted that although the flux layer 300 underneath the first conductive terminal 504 is connected to the flux layer 300 underneath the second conductive terminal 506, upon performing the reflow process, the flux layer 300 is self-aligned to render a plurality of first solders 300a and a plurality of second solders 300b. The first solders 300a and the second solders 300b are separated from each other. In other words, the first solder 300a is electrically insulated from the second solder 300b. The first conductive terminals 504 of the SMDs 500 are electrically connected to the first pads 110a through the first solders 300a and the second conductive terminal 506 of the SMDs 500 are electrically connected to the second pads 110b through the second solders 300b.

Figure 5A:
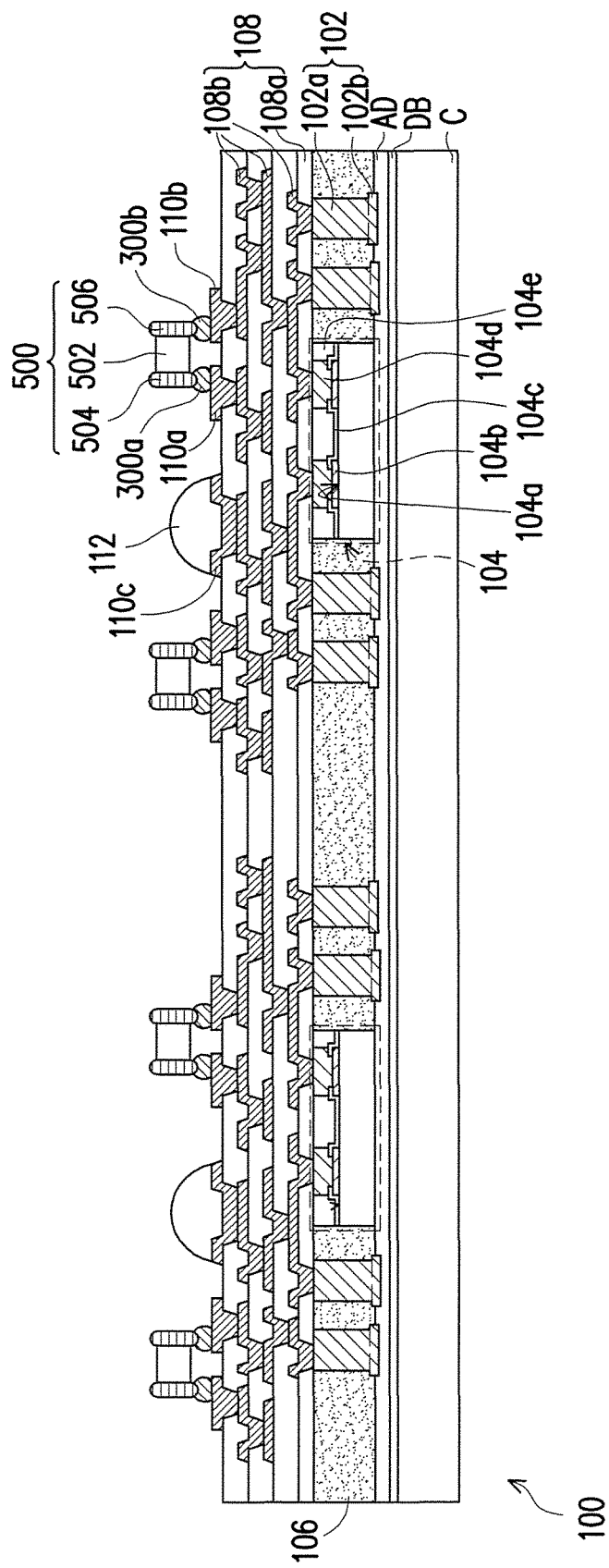
FIG. 5A-5E are cross-sectional views of steps of the method for manufacturing the package structure subsequent to the step depicted in FIGS. 2A-2E.

FIG. 5A-5E are cross-sectional views of steps of the method for manufacturing the package structure subsequent to the step depicted in FIGS. 2A-2E. Referring to FIG. 5A, after the SMDs 500 have been mounted onto the wafer 100, a plurality of terminals 112 are placed over the third pads 110c. In some embodiments, the terminals 112 may be placed on the third pads 110c through a ball placement process. The terminals 112 are, for example, solder balls. Since the terminals 112 are disposed over the third pads 110c, the third pads 110c may be referred as under-ball metallurgy (UBM) patterns.

Figure 5B:
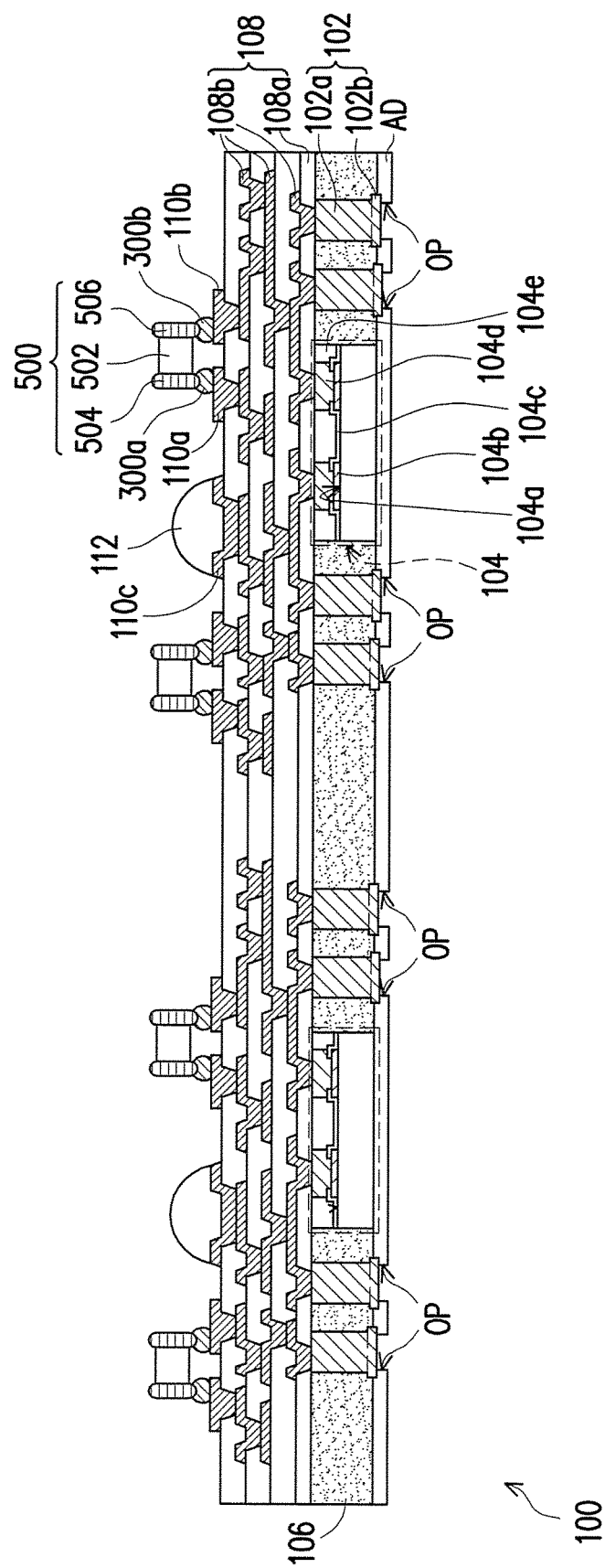

Referring to FIG. 5B, after the terminals 112 and the SMDs 500 are mounted on the redistribution circuit structure 108, the adhesion layer AD formed on the bottom surface of the insulating encapsulation 106 is de-bonded from the de-bonding layer DB such the adhesion layer AD is separated from the carrier C. In some embodiments, the de-bonding layer DB (e.g., the LTHC release layer) may be irradiated by an UV laser such that the adhesion layer AD adhered on the bottom surface of the insulating encapsulation 106 is peeled from the carrier C. As shown in FIG. 5B, the adhesion layer AD is then patterned such that a plurality of contact openings OP are formed to partially expose the second portions 102b of the conductive posts 102. The number of the contact openings OP is corresponding to the number of the conductive posts 102. In some embodiments, the contact openings OP of the adhesion layer AD are formed by a laser drilling process.

Figure 5C:
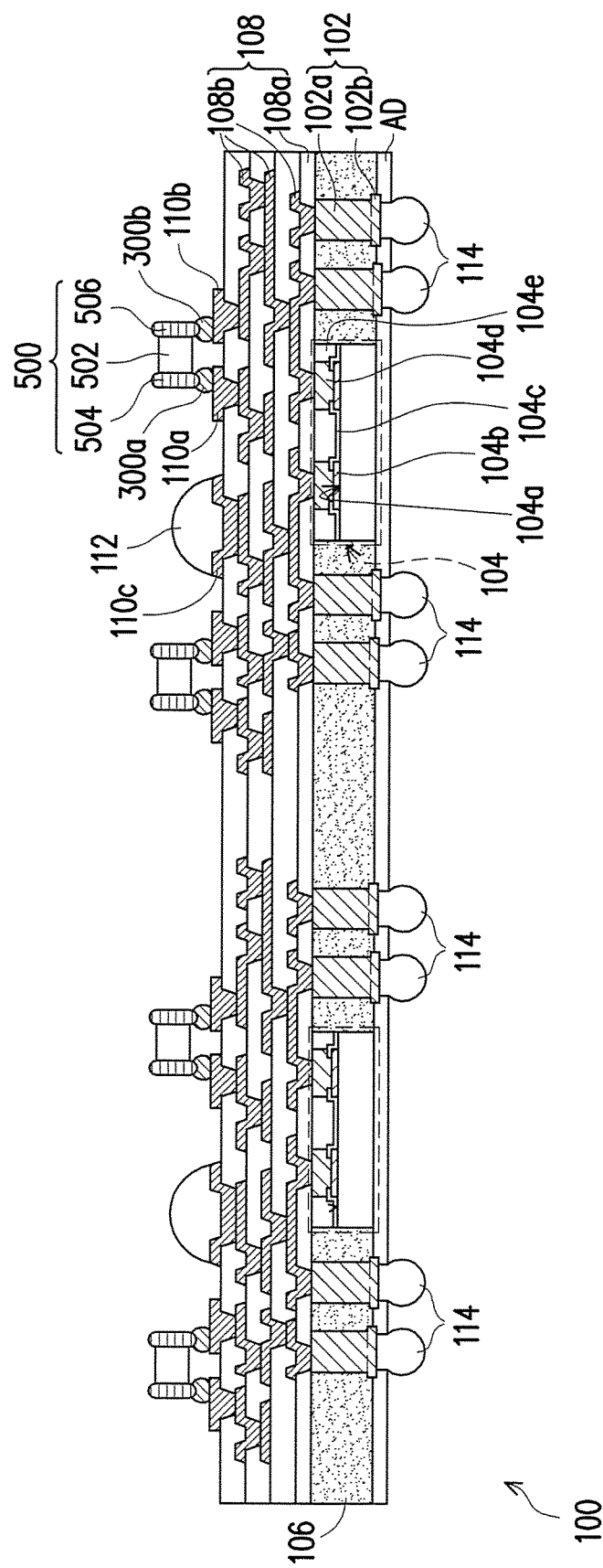

Referring to FIG. 5C, after the contact openings OP are formed in the adhesion layer AD, a plurality of terminals 114 are placed in the contact openings OP, and the terminals 114 are electrically connected to the second portions 102b of the conductive posts 102.

Figure 5D:
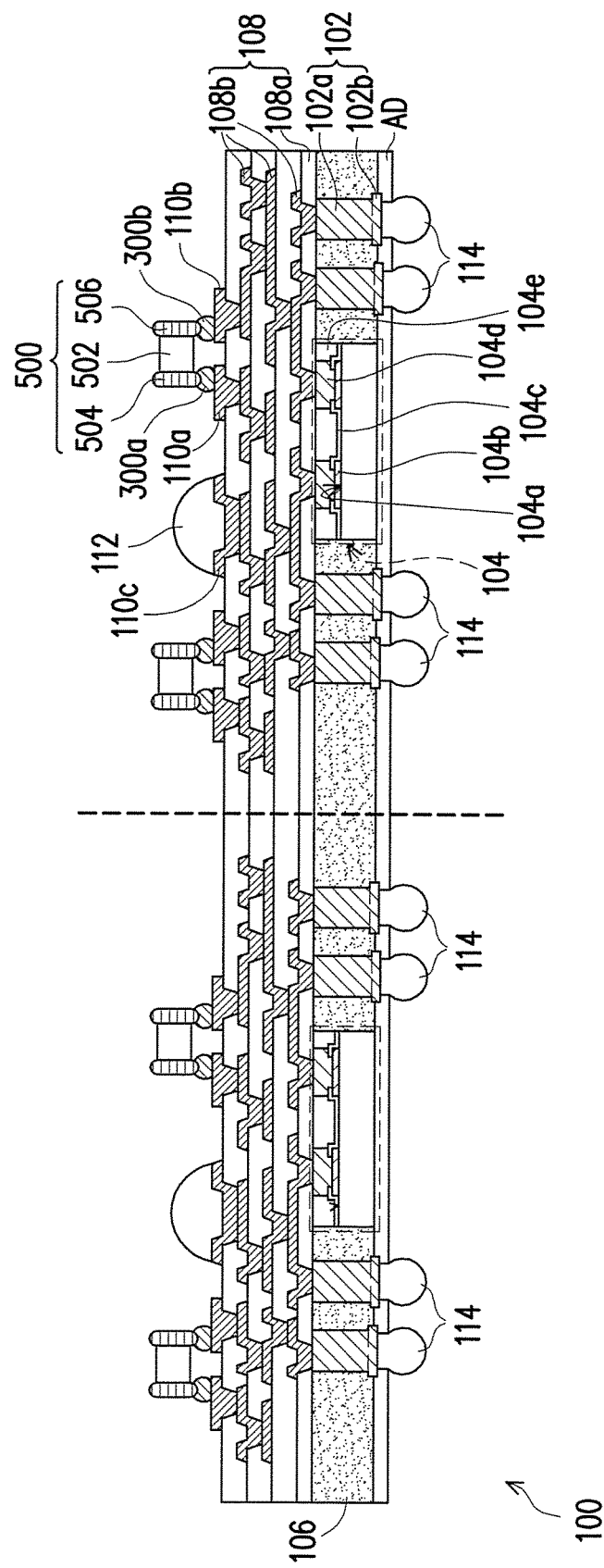
Figure 5E:
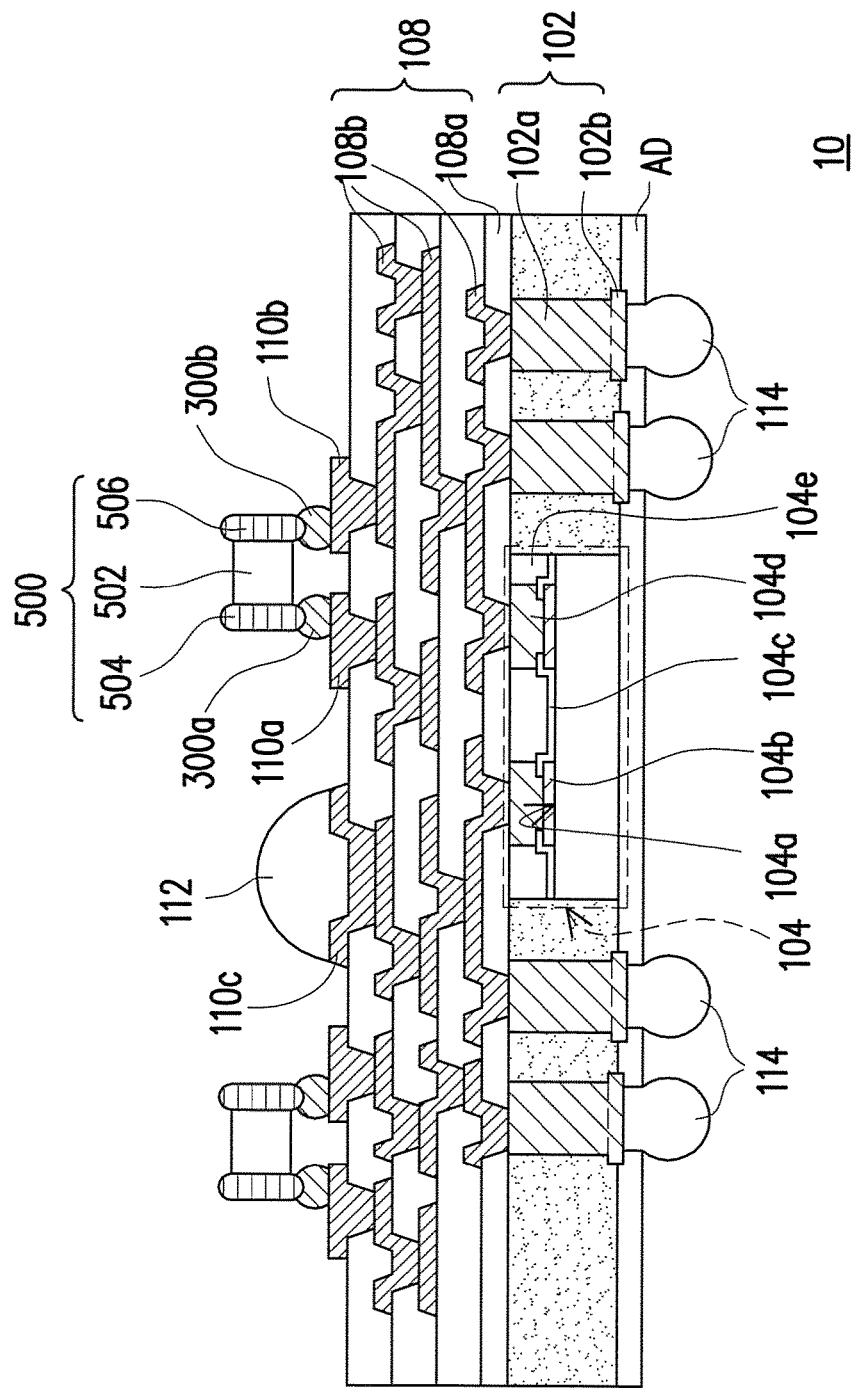

Referring to FIG. 5D and FIG. 5E, the wafer 100 is diced to form a plurality of package structures 10. In some embodiment, the dicing process or singulation process typically involves dicing the wafer 100 with a rotating blade or a laser beam. In other words, the dicing or singulation process is, for example, a laser cutting process or a mechanical cutting process.

Figure 6:
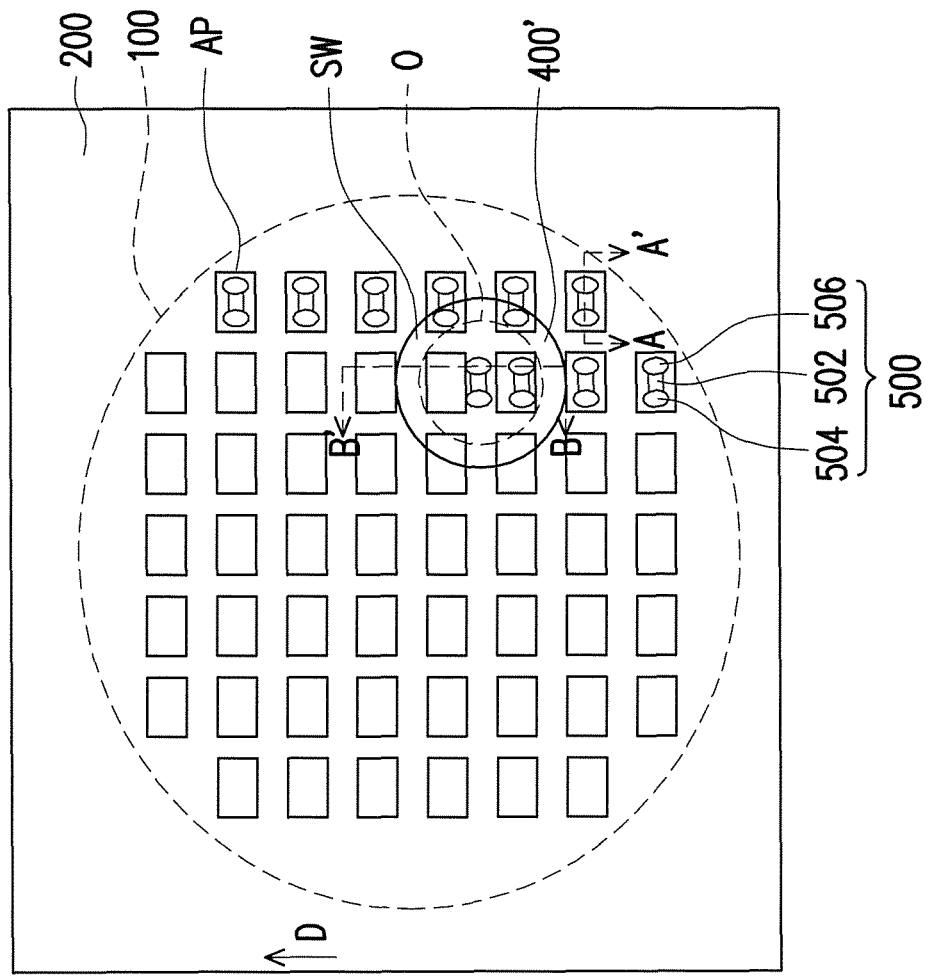
FIG. 6 is a schematic top view of a step of a method for manufacturing a package structure in accordance with some embodiments.

FIG. 6 is a schematic top view of a step of a method for manufacturing a package structure in accordance with some embodiments. FIGS. 7A-7E are cross-sectional views of the step along lines A-A' and B-B' depicted in FIG. 6. Referring to FIG. 6 and FIGS. 7A-7E, the processes in these figures are similar to the processes presented in FIGS. 2A-2E except the configuration of the dispenser 400' is different from the dispenser 400 of FIGS. 2A-2E. Specifically, the dispensing opening O of the dispenser 400' exhibits a circular shape, as illustrated in FIG. 6. Moreover, the sidewalls SW of the dispensing openings O are capable of ejecting air flow to form air walls AR. In some embodiments, the air walls AR extends from the sidewalls SW of the dispensing openings O to serve as virtual sidewalls.

Figure 7A:
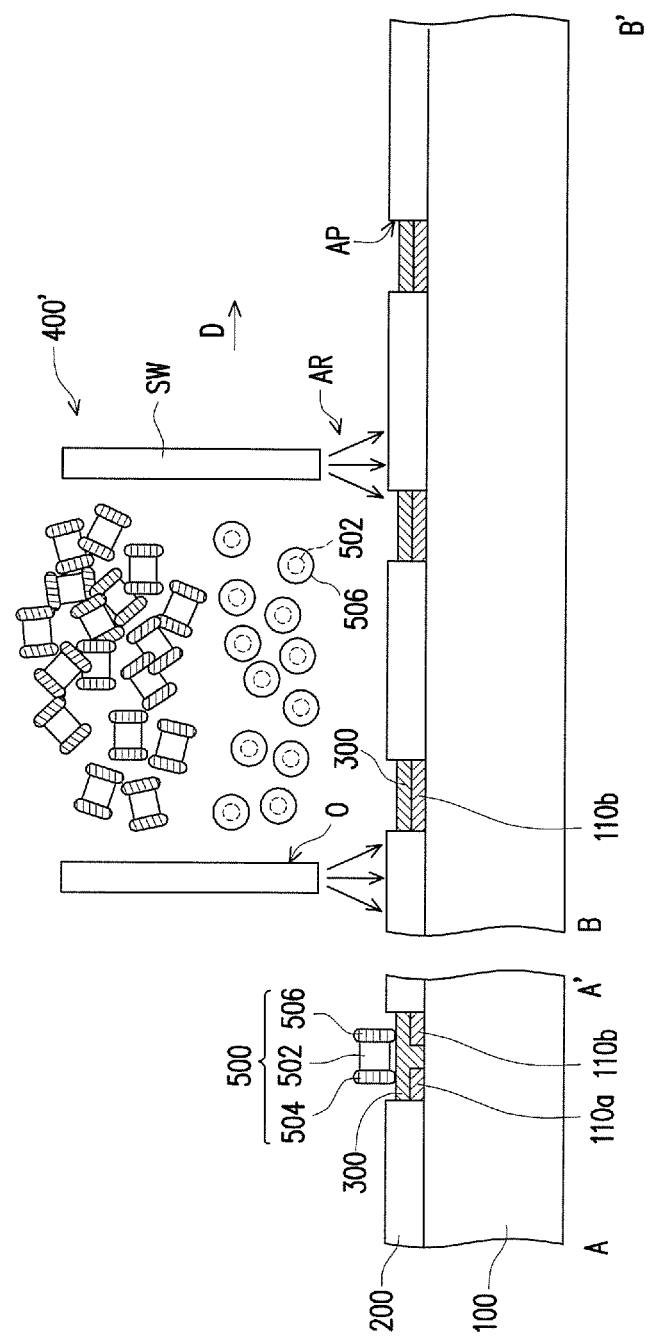
FIGS. 7A-7E are cross-sectional views of the step along lines A-A' and B-B' depicted in FIG. 6.
Figure 7B:
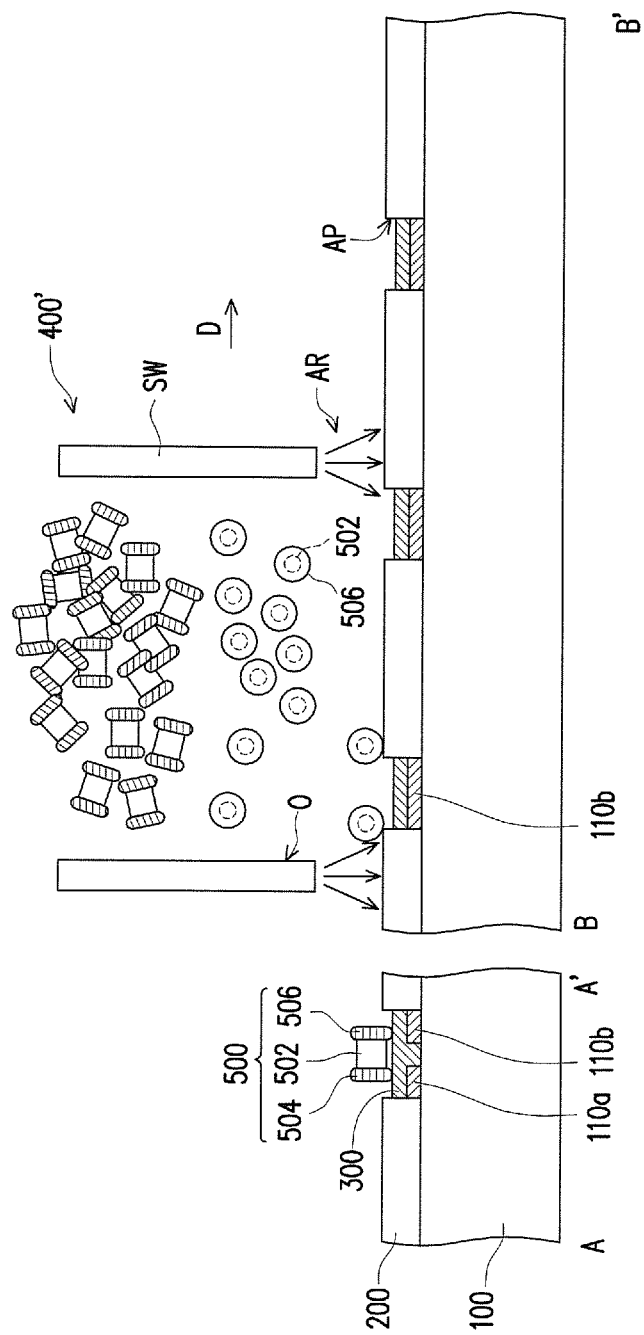
Figure 7C:
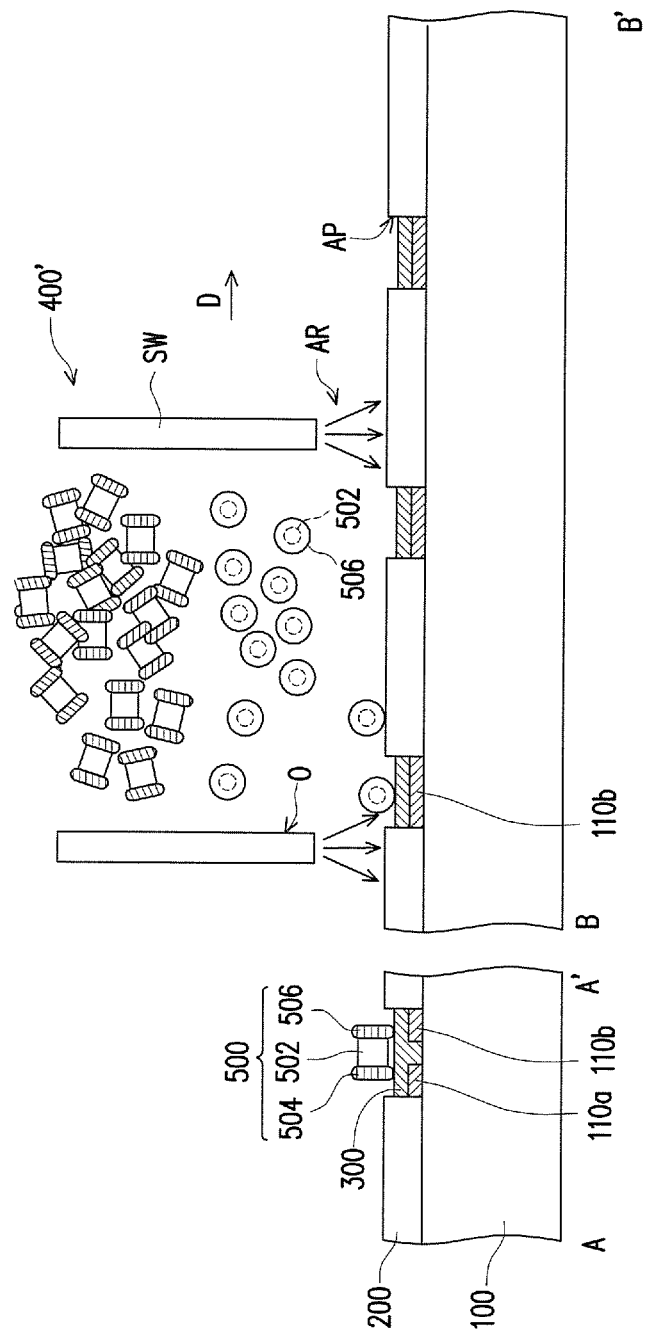
Figure 7D:
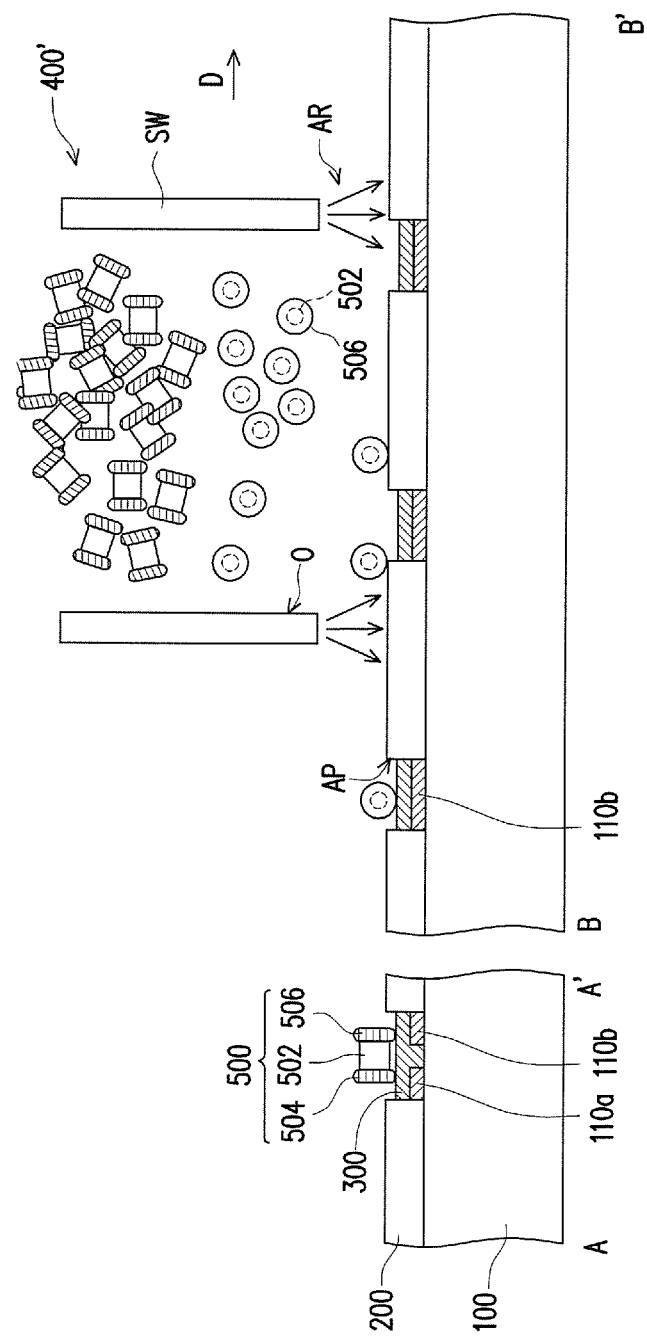

Referring to FIG. 7A and FIG. 7B, the dispenser 400' feeds a plurality of SMDs 500 over the stencil 200. Subsequently, referring to FIG. 7C and FIG. 7D, the dispenser 400' moves along a moving direction D, so the air walls AR are able to push the SMDs 500 into the apertures AP of the stencil 200 during the movement of the dispenser 400'. Since the air walls AR are able to drive the SMDs 500, during the movement of the dispenser 400', the SMDs 500 are contained within the air walls AR. Referring to FIG. 6, the dispenser 400' scans along the diameter direction of the wafer 100. In other words, the dispenser 400' scans back and forth along the moving direction D to cover the entire wafer 100. Moreover, in some embodiments, an area of the dispensing opening O corresponds to more than one apertures AP of the stencil 200. Therefore, while the dispenser 400' moves along the moving direction D, the air walls AR of the dispenser 400' are able to push the SMDs 500 such that each of the SMDs 500 is simultaneously being driven into each of the corresponding aperture AP overlapped with the dispensing opening O. In other words, multiple SMDs 500 may be mounted onto the wafer 100 at once. As such, mass production with shorter production time and lower manufacturing cost may be achieved.

Figure 7E:
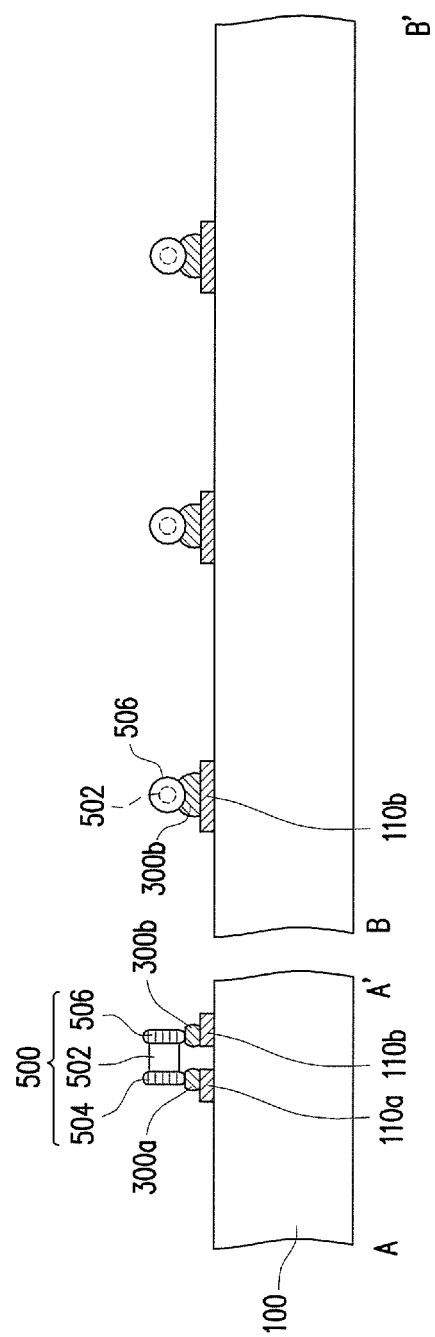

Referring to FIG. 7E, the stencil 200 is removed and a reflow process is performed on the flux layer 300 to bond the wafer 100 and the SMDs 500. Upon performing the reflow process, the flux layer 300 is self-aligned to render a plurality of first solders 300a and a plurality of second solders 300b. The first conductive terminals 504 of the SMDs 500 are electrically connected to the first pads 110a through the first solders 300a and the second conductive terminal 506 of the SMDs 500 are electrically connected to the second pads 110b through the second solders 300b. Subsequent to the processes presented in FIGS. 7A-7E, processes illustrated in FIGS. 5A-5E may be performed to render a plurality of package structure 10.

In accordance with some embodiments of the present disclosure, a method of manufacturing a package structure includes at least the following steps. A wafer is provided. A flux layer is applied onto at least part of the wafer. A stencil is provided over the wafer. The stencil includes a plurality of apertures exposing the flux layer. A dispenser is provided over the stencil. A plurality of SMDs are fed over the stencil with the dispenser. The dispenser is moved to drive the SMDs into the apertures of the stencil. The stencil is removed and the flux layer is reflowed.

In accordance with some embodiments of the present disclosure, a method of manufacturing a package structure includes at least the following steps. A wafer having a plurality of INFO packages arranged in an array is provided. The wafer includes a plurality of first pads and a plurality of second pads. A flux layer is formed on the first pads and the second pads. A stencil is provided over the wafer. The stencil includes a plurality of apertures exposing the flux layer. A dispenser is provided over the stencil. The dispenser includes a dispensing opening and a squeegee. A plurality of SMDs are fed from the dispensing openings of the dispenser onto the stencil. Each of the SMDs includes a body, a first conductive terminal, and a second conductive terminal. The first conductive terminal and the second conductive terminal are respectively located on two ends of the body. The dispenser is moved to scrape the SMDs into the apertures with the squeegee. The first conductive terminals are connected to the first pads through the flux layer and the second conductive terminals are connected to the second pads through the flux layer. The stencil is removed. The flux layer is reflowed, so as to bond the wafer and the SMDs.

In accordance with some embodiments of the present disclosure, a method of manufacturing a package structure includes at least the following steps. A wafer having a plurality of INFO packages arranged in an array is provided. The wafer includes a plurality of first pads and a plurality of second pads. A flux layer is formed on the first pads and the second pads. A stencil is provided over the wafer. The stencil includes a plurality of apertures exposing the flux layer. A dispenser is provided over the stencil. The dispenser includes a dispensing opening, and sidewalls of the dispensing opening are capable of ejecting an air flow to form air walls. A plurality of SMDs are fed from the dispensing openings of the dispenser onto the stencil. Each of the SMDs includes a body, a first conductive terminal, and a second conductive terminal. The first conductive terminal and the second conductive terminal are respectively located on two ends of the body. The dispenser is moved to push the SMDs into the apertures with the air walls. The first conductive terminals are connected to the first pads through the flux layer and the second conductive terminals are connected to the second pads through the flux layer. The stencil is removed. The flux layer is reflowed, so as to bond the wafer and the SMDs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a package structure, comprising
   providing a wafer;
   applying a flux layer onto at least part of the wafer;
   providing a stencil over the wafer, wherein the stencil comprises a plurality of apertures exposing the flux layer;
   providing a dispenser over the stencil;
   feeding a plurality of surface mount devices (SMD) over the stencil with the dispenser;
   moving the dispenser to drive the SMDs into the apertures of the stencil;
   removing the stencil; and
   reflowing the flux layer.

2. The method according to claim 1, further comprising: forming a plurality of terminals over the wafer.

3. The method according to claim 1, wherein the step of moving the dispenser to drive the SMDs comprises scraping the SMDs with a squeegee.

4. The method according to claim 1, wherein the step of moving the dispenser to drive the SMDs comprises pushing the SMDs with an air flow generated by the dispenser.

5. The method according to claim 1, wherein the step of moving the dispenser to drive the SMDs comprises vibrating the SMDs and tilting the wafer.

6. A method of manufacturing a package structure, comprising
providing a wafer having a plurality of integrated-fan out (INFO) packages arranged in an array, wherein the wafer comprises a plurality of first pads and a plurality of second pads;
forming a flux layer on the first pads and the second pads;
providing a stencil over the wafer, wherein the stencil comprises a plurality of apertures exposing the flux layer;
providing a dispenser over the stencil, wherein the dispenser comprises a dispensing opening and a squeegee;
feeding a plurality of surface mount devices (SMD) from the dispensing opening of the dispenser onto the stencil, wherein each of the SMDs comprises a body, a first conductive terminal, and a second conductive terminal, the first conductive terminal and the second conductive terminal are respectively located on two ends of the body;
moving the dispenser to scrape the SMDs into the apertures with the squeegee, wherein the first conductive terminals are connected to the first pads through the flux layer and the second conductive terminals are connected to the second pads through the flux layer;
removing the stencil; and
reflowing the flux layer, so as to bond the wafer and the SMDs.

7. The method according to claim 6, wherein an area of the dispensing opening corresponds to more than one apertures of the stencil.

8. The method according to claim 6, wherein the squeegee extends from a sidewall of the dispensing opening.

9. The method according to claim 6, wherein a shape of the body comprises rectangle, cylinder, or octagon.

10. The method according to claim 6, wherein a shape of the first conductive terminal and the second conductive terminal comprises cylinder or octagon.

11. The method according to claim 6, wherein the step of applying the flux layer onto the first pads and the step of applying the flux layer onto the second pads are performed simultaneously.

12. The method according to claim 6, wherein the step of applying the flux layer onto the second pads is performed after the step of applying the flux layer onto the first pads is completed.

13. The method according to claim 6, further comprising:
forming a plurality of terminals over the wafer.

14. A method of manufacturing a package structure, comprising providing a wafer having a plurality of integrated-fan out (INFO) packages arranged in an array, wherein the wafer comprises a plurality of first pads and a plurality of second pads;
forming a flux layer on the first pads and the second pads;
providing a stencil over the wafer, wherein the stencil comprises a plurality of apertures exposing the flux layer;
providing a dispenser over the stencil, wherein the dispenser comprises a dispensing opening, and sidewalls of the dispensing opening are capable of ejecting an air flow to form air walls;
feeding a plurality of surface mount devices (SMD) from the dispensing opening of the dispenser onto the stencil, wherein each of the SMDs comprises a body, a first conductive terminal, and a second conductive terminal, the first conductive terminal and the second conductive terminal are respectively located on two ends of the body;
moving the dispenser to push the SMDs into the apertures with the air walls, wherein the first conductive terminals are connected to the first pads through the flux layer and the second conductive terminals are connected to the second pads through the flux layer;
removing the stencil; and
reflowing the flux layer, so as to bond the wafer and the SMDs.

15. The method according to claim 14, wherein an area of the dispensing opening corresponds to more than one apertures of the stencil.

16. The method according to claim 14, wherein during the step of moving the dispenser, the SMDs are contained within the air walls.

17. The method according to claim 14, wherein a shape of the body comprises rectangle, cylinder, or octagon.

18. The method according to claim 14, wherein a shape of the first conductive terminal and the second conductive terminal comprises cylinder or octagon.

19. The method according to claim 14, wherein the step of applying the flux layer onto the first pads and the step of applying the flux layer onto the second pads are performed simultaneously.

20. The method according to claim 14, wherein the step of applying the flux layer onto the second pads is performed after the step of applying the flux layer onto the first pads is completed.

* * * * *